United States Patent [19]

Narain

[11] Patent Number: 5,740,182
[45] Date of Patent: Apr. 14, 1998

[54] METHOD AND APPARATUS FOR TESTING A CIRCUIT WITH REDUCED TEST PATTERN CONSTRAINTS

[75] Inventor: Prakash Narain, San Carlos, Calif.

[73] Assignee: Sun Microsystems, Inc., Mountain View, Calif.

[21] Appl. No.: 672,990

[22] Filed: Jul. 1, 1996

[51] Int. Cl.$^6$ .................................................. G01R 31/28
[52] U.S. Cl. ..................... 371/22.3; 371/22.1; 371/22.2; 324/158.1
[58] Field of Search .............................. 371/22.3, 22.1, 371/22.2, 22.5, 22.6; 324/158.1

[56] References Cited

U.S. PATENT DOCUMENTS

| | | | |
|---|---|---|---|
| 5,363,383 | 11/1994 | Nimishakavi | 371/22.1 |
| 5,406,567 | 4/1995 | Ogawa | 371/22.1 |
| 5,642,362 | 6/1997 | Savir | 371/22.3 |

Primary Examiner—Hoa T. Nguyen
Attorney, Agent, or Firm—Skjerven, Morrill, MacPherson, Franklin & Friel LLP; Lawrence E. Lycke

[57] ABSTRACT

A method and structure for testing a circuit with reduced test pattern generation constraints. The circuit includes a first logic circuit coupled to receive input signals from a first flip-flop and a second flip-flop. The first and second flip-flops store part of a test pattern generated to test the circuit. The circuit also includes first and second three state driver (TSD) circuits coupled to receive output signals from the first logic circuit. The output leads of the first and second TSDs are connected to a single input lead of a second logic circuit. The first and second TSDs receive control signals that enable and disable the first and second TSDs. The control signals are provided by the first logic circuit or, alternatively, by a separate decoder. During test operations, the control signals enable the first and second TSDs substantially simultaneously for a predetermined duration. The predetermined duration is short enough to prevent burnout of the first and second TSDs when outputting signals of different logic levels. The predetermined duration is long enough to allow the test pattern to propagate through the second logic circuit and load the output signals of the second logic circuit into third and fourth flip-flops.

32 Claims, 6 Drawing Sheets

METHOD AND APPARATUS FOR TESTING A CIRCUIT WITH REDUCED TEST PATTERN CONSTRAINTS

FIELD OF THE INVENTION

The present invention is related to test circuitry and, more particularly, to scan design test circuitry and test pattern generation.

BACKGROUND

In many high speed applications such as, for example, microprocessors, multiple three-state drivers (TSDs) are used in some circuits to drive a single conductive line. In normal functional operation, only one of the TSDs in such a circuit is activated at any given time to drive the conductive line, with the rest of the TSDs drying the conductive line being disabled. By enabling only one TSD at a time, the circuit avoids high current conditions in the TSDs resulting from contention on the conductive line. This contention can damage or "burnout" the TSDs as well as result in an undefined data signal being placed on the conductive line. More specifically, if one TSD was attempting to drive a logic zero on the conductive line while another TSD was attempting to drive a logic one, then these TSDs would, in effect, create a short circuit between the supply rails. As a result, a high current condition is created that can burnout these TSDs. Consequently, the circuit is designed to ensure that only one TSD can drive the conductive line at any given time.

FIG. 1 is a block diagram illustrating one such multiple-TSD circuit in a circuit 100 that is adapted for scan design testing. Flip-flops $102_1$–$102_O$ form an input register 102 that is connected to a logic circuit 104. The input register 102 can be serially loaded with test patterns to test the logic circuit 104 using well known scan design techniques. It is appreciated that clock, scan-in and scan-out lines interconnect the flip-flops $102_1$–$102_O$, which are omitted for clarity.

The logic circuit 104 is connected to TSDs $106_1$–$106_N$ through conductive lines $108_1$–$108_N$. The TSDs $106_{1-106N}$ have output leads $110_1$–$110_N$ connected to an input lead 112 of a logic circuit 114. A decoder 116 is connected to the disable terminals of the TSDs $106_1$–$106_N$ through lines $118_1$–$118_N$ to prevent concurrent activation of the TSDs $106_1$–$106_N$ during normal functional operation, as described above. The logic circuit 114 includes output leads $120_1$–$120_M$ that are connected to flip-flops $122_1$–$122_M$, respectively. The flip-flops $122_1$–$122_M$ form a register 122, which serves as an output register for the logic circuit 114.

The register 122 then serves as the input register of a third logic circuit 124, which receives the output signals of the register 122. The logic circuit 124 provides input signals to TSDs $126_1$–$126_L$ through output leads $128_1$–$128_L$, respectively. The decoder 116 also provides control signals to the disable input terminals of the TSDs $126_1$–$126_L$, through leads $129_1$–$129_L$. Similarly, the output leads $130_1$–$130_L$ of the TSDs $126_1$–$126_L$ are connected to line 132. Because the output leads $130_1$–$130_L$ are connected together, the decoder 116 also controls the TSDs $126_1$–$126_L$ to avoid burnout during normal functional mode operation.

Although not shown, the logic circuit 104 provides additional output signals to the logic circuit 114 through additional multiple-TSDs (omitted for clarity). Thus, the test pattern loaded into the register 102 causes the logic circuit 104 to provide several input signals to the logic circuit 114 that the decoder 116 also must control signals to these TSDs to avoid burnout during the normal functional mode.

Likewise, the logic circuit 124 also provides additional output signals through additional TSDs (omitted for rarity). Because of the decoder 116, the circuit 100 is often used in relatively low speed applications.

FIG. 1A illustrates an alternative conventional circuit 100A for high speed applications (e.g., microprocessor applications) substantially similar to the circuit 100 (FIG. 1), except that the decoder 116 (FIG. 1) is eliminated by replacing the logic circuit 104 (FIG. 1) with a logic circuit 104A that provides control signals to the TSDs $106_1$–$106_N$ that enable or disable the TSDs. When the circuit 100A is in the functional mode, the logic circuit 104A provides to the TSDs $106_1$–$106_N$ disable signals ensured to be mutually exclusive by state assignment and logic design.

The multiple-TSD circuits of FIG. 1A are tested using well known scan design techniques. As is well known in the art of test circuits, in scan design, a circuit is tested by: (a) configuring the circuit into a scan mode; (b) "scanning in" a test pattern into an input register of the circuit; (c) configuring the circuit into a normal functional mode; (d) pulsing the circuit (i.e., allowing the circuit to operate for one clock cycle on the test pattern) and capturing the resultant output signals in an output register; (e) configuring the circuit into the scan mode; and (f) "scanning out" the captured data from the output register for comparison with the expected values. In general, the input and output registers are serially coupled in a scan chain that allows scan design testing of several circuits in the integrated circuit.

FIG. 2 shows a block diagram of a typical conventional flip-flop which is used to implement the scan chain of the scan design circuit. Each flip-flop has a data input terminal D, an output terminal Q and a clock input terminal Clk. In addition, each flip-flop has a scan-in terminal si, a scan-out terminal so and a scan-enable terminal se. The scan-in terminal si of each flip-flop is generally connected to the scan-out terminal so of an adjacent flip-flop in the scan chain. The scan-in terminal of the first flip-flop in the scan chain is typically connected to an input/output (I/O) pin of the integrated circuit. Similarly, the scan-out terminal of the last flip-flop in the scan chain is typically connected to another I/O pin. The flip-flop is configured into the scan mode and the functional mode by asserting and deasserting a scan-enable signal received at the flip-flop's scan-enable terminal se, respectively. Some scan design flip-flops have an additional scan clock input terminal, which are used in a scan design technique commonly referred to as docked scan.

FIG. 3 is an exemplary timing diagram illustrating the testing of circuit 100A (FIG. 1A). To test the circuit 100A, the scan-enable signal se and the disable signal dis for all of the flip-flops in the circuit 100A are asserted, thereby causing the circuit 100A to enter the scan mode. Consequently, the flip-flops are loaded with the values currently at their data input terminals, and the TSDs $106_1$–$106_N$ (FIG. 1) are configured in the high impedance state. Alternatively, the TSDs $106_1$–$106_N$ may be enabled, with the loaded flip-flops generating a safe state (i.e., the output signals of the logic circuit 104A causing the TSDs $106_1$–$106_N$ to provide output signals of the same logic level). In this conventional scheme, the disable signal dis is substantially identical to the scan enable signal se during testing. Consequently, a single signal can be used for both the disable signal dis and the scan-enable signal se, as shown in FIG. 3. Other embodiments may use an enable signal instead of a disable signal to control the TSDs. In these embodiments, the enable signal would simply be the complement of the scan-enable signal se.

As shown in FIG. 3, the next several dock cycles are the scan cycles 302 during which scan-in data is serially loaded into the flip-flops on the rising edges of the scan cycles. The scan-enable signal se and the disable signal dis remain asserted for all of the scan cycles except the last half of the last scan cycle, thereby keeping the circuit 100A in the scan mode while the scan-in data is loaded. During the last scan cycle of the scan cycles 302 after all of the scan-in data is loaded, the scan-enable signal se and the disable signal dis are deasserted. As a result, the TSDs $106_1$–$106_N$ are enabled, allowing output signals from the logic circuit 104A (FIG. 1) to be received by the logic circuit 114 (FIG. 1). The logic circuit 114 then operates on these output signals to provide output signals to the output register 122 (FIG. 1). The next clock cycle is commonly called the capture pulse CP, during which the output signals of the logic circuit 114 are "captured" or loaded into the output register 122. The data captured in the output register 122 is commonly referred to as the capture data.

To scan out the capture data, before the rising edge of the next clock cycle after the capture pulse CP, the scan-enable signal se and the disable signal dis to all of the flip-flops in the circuit 100A are re-asserted, thereby causing the circuit 100A to enter the scan mode. The next several clock cycles are the scan cycles 304 during which the capture data is serially scanned out for comparison with the expected values.

Referring back to the capture pulse CP, after the capture data is loaded into the flip-flops $122_1$–$122_M$ (FIG. 1), the capture data is received by the logic circuit 124 (FIG. 1). Thus, the logic circuit 124 then operates on the capture data, generating output signals that are dependent on the capture data (and thus, the test pattern loaded into the register 102) to the TSDs $126_1$–$126_M$ (FIG. 1).

A problem arises because in the scan mode, all of the TSDs can be enabled after the logic circuit 104 operates on the test pattern. Because multiple TSDs of a multi-TSD circuit can be enabled, a high current condition is possible. Consequently, the test pattern must be generated under the constraint that if the logic circuit 104A operates properly, all of the enabled TSDs of each multi-TSD circuit are generating output signals of the same logic level (i.e., the test pattern must be burnout proof). The time and expense of the generating a burnout proof test pattern can be substantial for large logic circuits (e.g., microprocessor circuits).

Further, the test pattern must be generated under a second constraint. In this example, the capture data drives another set of TSDs (which includes TSDs $126_1$–$126_L$) through the logic circuit 124. Accordingly, the test pattern is further constrained to generate capture data that avoids burnout in the TSDs driven by the logic circuit 124. These constraints on the test pattern increase the complexity and cost of the test pattern generation. Moreover, these constraints can prevent complete testing of the circuit 100 (i.e., incomplete test coverage) because in some cases, the only test patterns that can test a portion of a circuit cause burnout.

The circuit 100A (FIG. 1A) operates in substantially the same manner, except that the logic circuits 104A and 124A provide the disable signals to their corresponding TSDs. Consequently, the timing diagram of FIG. 3 and the aforementioned test pattern constraints also applies to the circuit 100A.

SUMMARY

In accordance with the present invention, a method and structure for testing a circuit with reduced test pattern generation constraints is provided. In one embodiment, the circuit includes a first logic circuit coupled to receive input signals from a first storage element and a second storage element. The first and second storage elements store part of a test pattern generated to test the circuit. The circuit also includes first and second driver circuits coupled to receive output signals from the first logic circuit. In this embodiment, the driver circuits are TSDs and the storage elements are flip-flops.

The output leads of the first and second driver circuits are connected to a single input lead of a second logic circuit. In addition, the first and second driver circuits are coupled to receive control signals that selectively enable and disable the first and second driver circuits. In this embodiment, the control signals are provided by the first logic circuit. During a test operation, the control signals enable the first and second driver circuits substantially simultaneously for a predetermined time duration after the rising edge of the capture clock.

The predetermined time duration is short enough to prevent burnout of the first and second driver circuits if the first and second driver circuits were outputting signals of different logic levels. Further, the predetermined time duration is long enough to allow the test pattern to account for hold time requirements of the second logic circuit, due to clock skew. This embodiment can be used advantageously to eliminate the constraint that the capture data avoid burnout. This scheme with reduced test pattern generation constraints greatly reduces the time needed to generate test patterns and, moreover, facilitates the generation of test patterns with complete test coverage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 4:
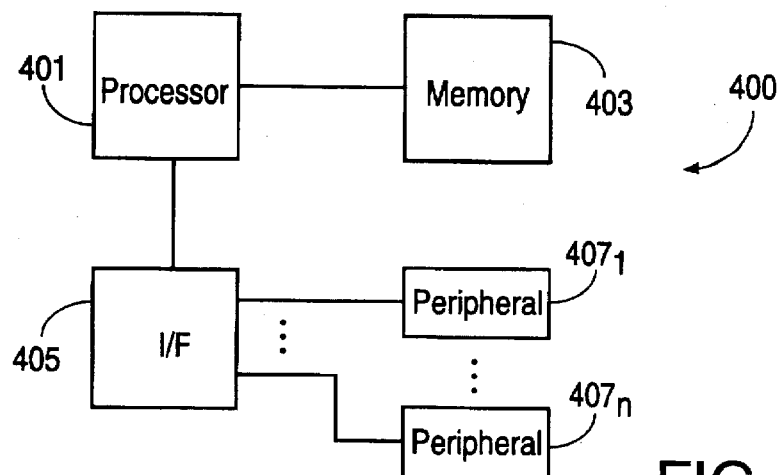
FIG. 4 is a block diagram of an electronic system with an integrated circuit using a test method and structure according to one embodiment of the present invention.

FIG. 4 is a block diagram of an electronic system 400 having an integrated circuit 401 using a test method and structure according to one embodiment of the present invention. The electronic system 400 can be any type of electronic system. In this embodiment, the electronic system 400 is a computer system in which the integrated circuit 401 is a processor connected to a memory 403 and to interfaces 405. The interfaces 405 are connected to peripherals $407_1$–$407_N$, thereby allowing the processor to interact with these peripherals. The memory 403 and the interfaces 405 can be any type of memory or interface for use in computer systems. Likewise, the peripherals can be any type of peripheral such as, for example, displays, mass storage devices, keyboards or any other type of input or input-output device. In accordance with the present invention, the integrated circuit 201 includes test circuits that utilize test methods that reduce test pattern generation constraints, compared to conventional testing schemes.

Figure 1:
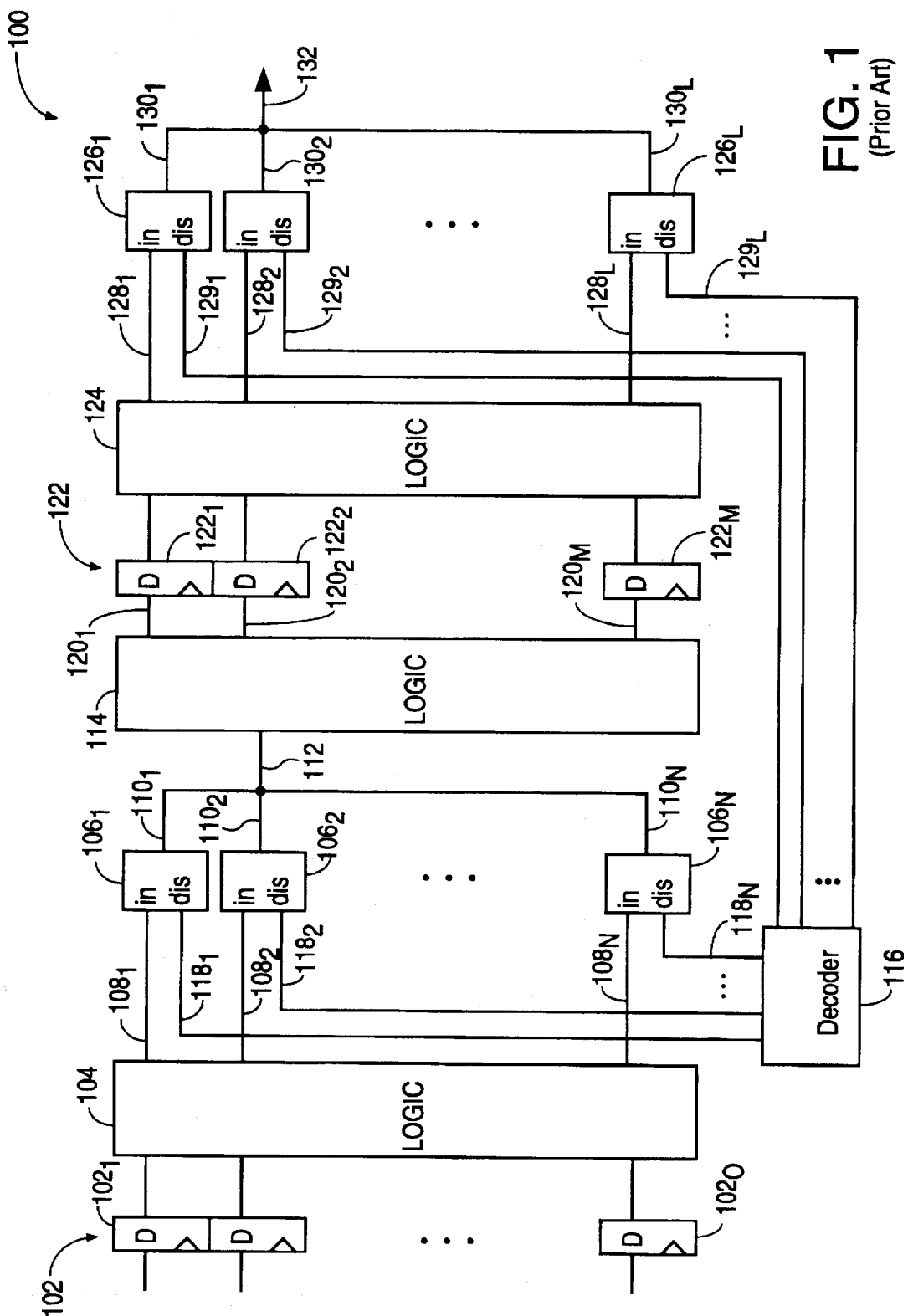
FIGS. 1 and 1A are block diagrams of conventional circuits with scan design.
Figure 1A:
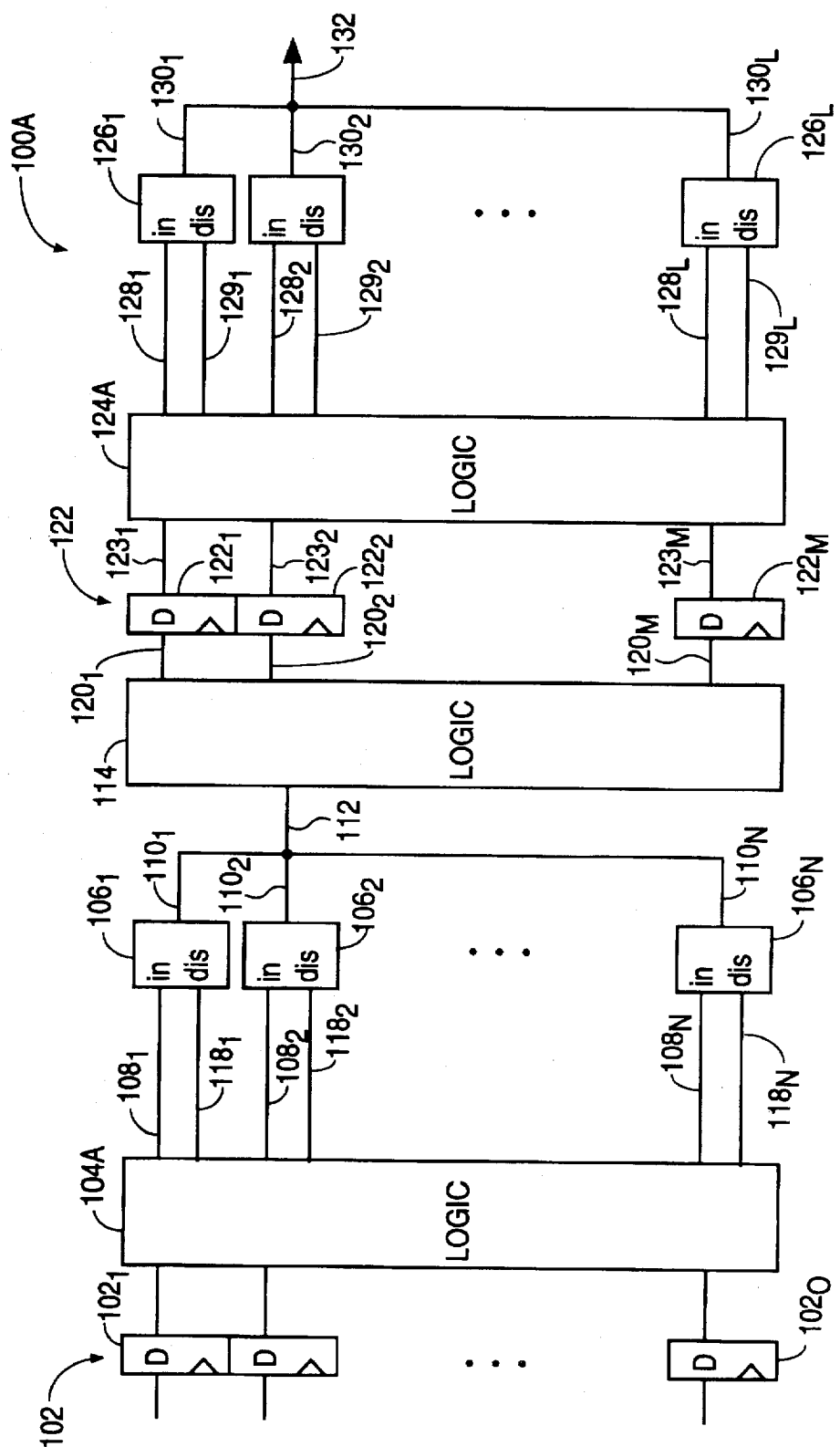
Figure 2:
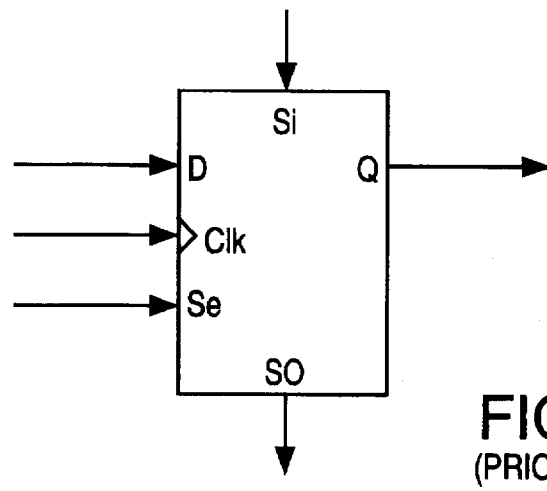
FIG. 2 is a block diagram of a conventional flip-flop with scan design capability.
Figure 3:
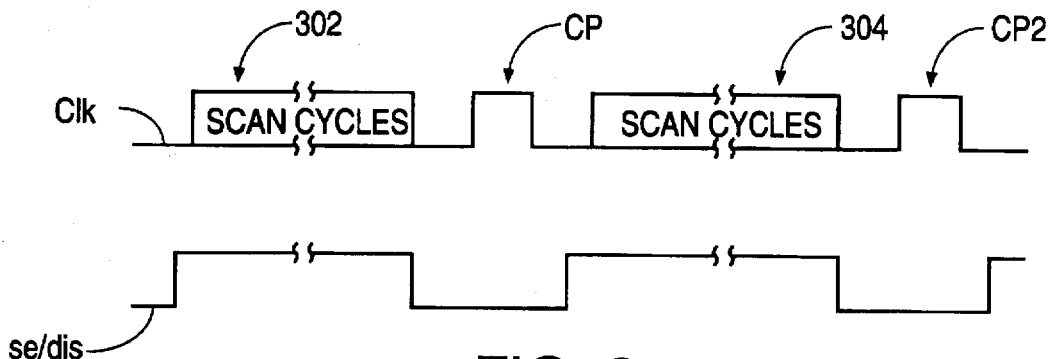
FIG. 3 is a timing diagram illustrating the test sequence of a conventional circuit using scan design testing.
Figure 5:
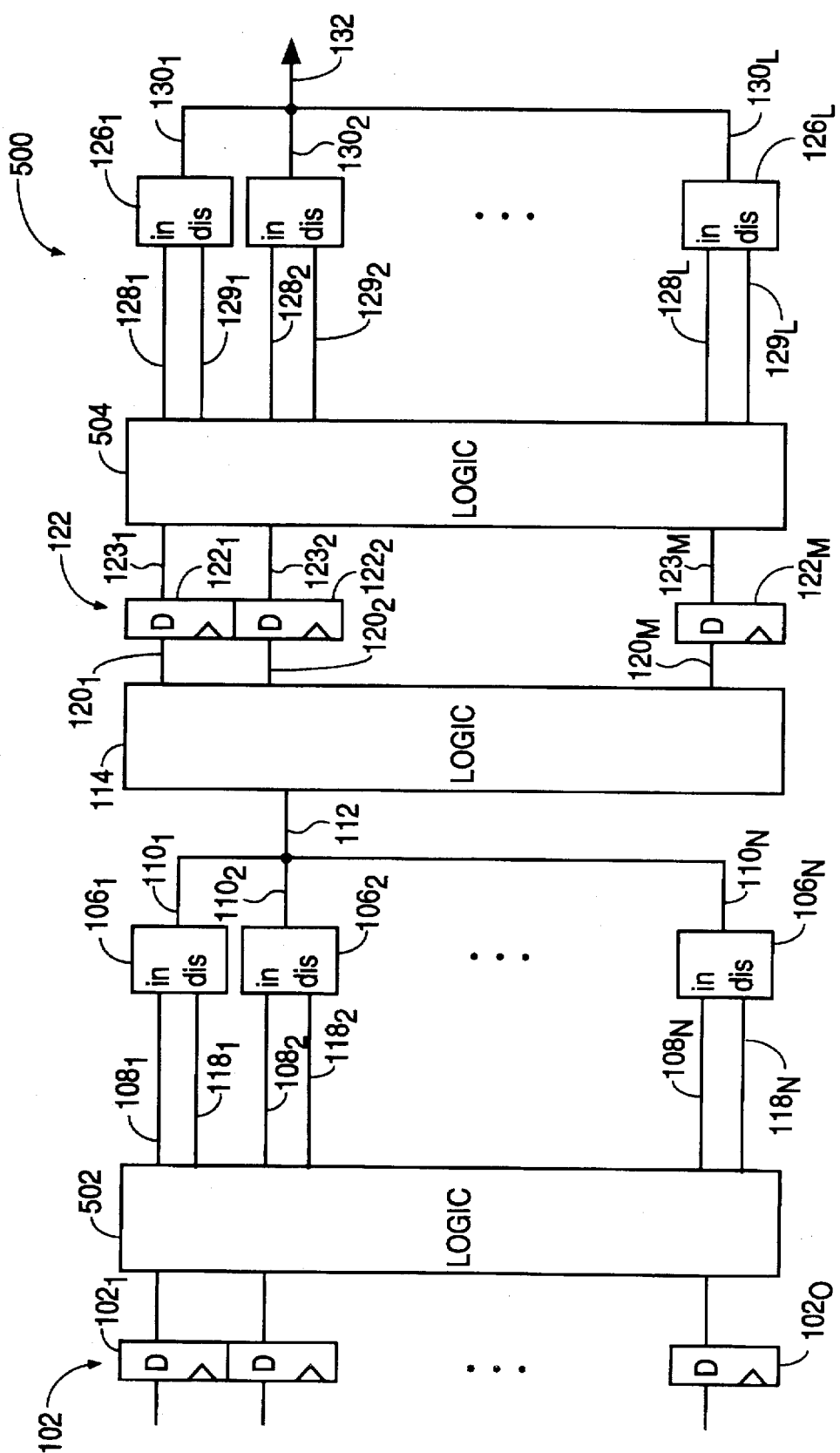
FIG. 5 is a block diagram of circuit with reduced test pattern constraints according to one embodiment of the present invention.

FIG. 5 is a block diagram of circuit 500 with reduced test pattern constraints according to one embodiment of the present invention. The circuit 500 is substantially identical in structure to the circuit 100A (FIG. 1A), except that the circuit 500 respectively includes logic circuits 502 and 504 with disable subcircuits 505 instead of conventional logic circuits 104A and 124A (FIG. 1A) in the circuit 100. In this embodiment, during the scan mode the disable subcircuit 505 generates a negative pulse to serve as the disable signal dis (described further below in conjunction with FIG. 6). In this embodiment, the disable signal dis and the scan-enable signal se are active high signals.

The circuit 500 is also substantially similar in operation to the circuit 100A, except that the logic circuits 502 and 504 each use the disable subcircuit 505 to provide the disable signal dis to the TSDs $106_1$–$106_N$ and TSDs $126_1$–$126_L$. The disable subcircuit 505 deasserts the disable signal dis after the test pattern is loaded into the flip-flops $102_1$–$102_O$ and before the capture pulse is generated. Then, during the capture pulse, the disable subcircuit 505 reasserts the disable signal dis. As a result, the flip-flops $122_1$–$122_M$ do not provide the capture data to the logic circuit 504 until the capture data is loaded on the rising edge of the capture pulse, which causes the TSDs $126_1$–$126_L$ to drive the output signals from the logic circuit 504 for approximately a predetermined time duration $\Delta t$ after the rising edge of the capture pulse.

The predetermined duration $\Delta t$ is short enough to prevent burnout of any of TSDs $126_1$–$126_L$ that were outputting signals of different logic levels onto the input lead 132 of the logic circuit 504. For many integrated circuit fabrication technologies, the TSDs can enter a high current condition for about two nanoseconds without significant damage. Further, the predetermined time duration $\Delta t$ is long enough to account for the data hold time requirements (due to clock skew) of the register 122. In many applications, the data hold time requirements are about one-half of a nanosecond, down to about a quarter nanosecond in relatively fast applications. Thus, in this embodiment, the predetermined time duration $\Delta t$ is about one quarter to two nanoseconds. As a result, the TSDs $126_1$–$126_L$ will not burnout when driving different logic values onto the lines 112 and 132, respectively.

Figure 6:
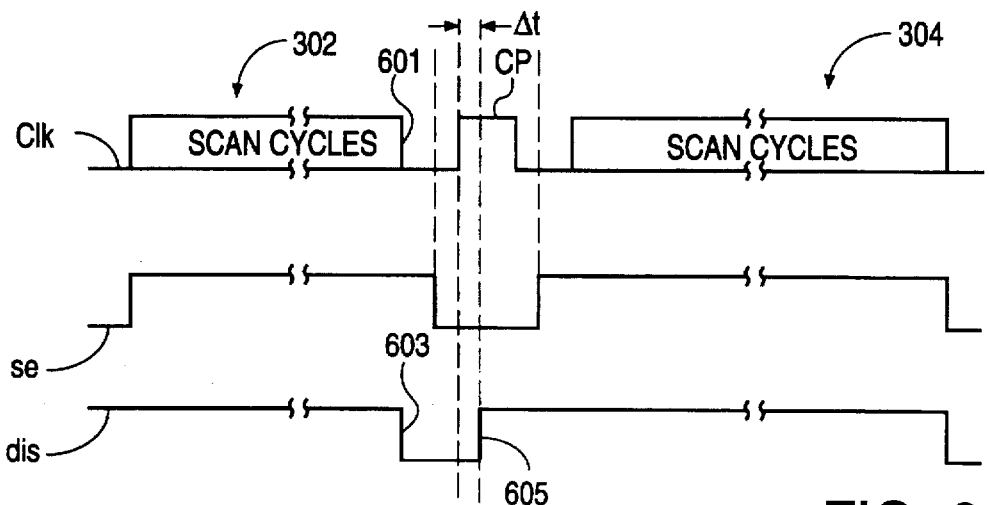
FIG. 6 is a timing diagram illustrating the operation of the circuit depicted in FIG. 5.

Referring to FIGS. 5 and 6, in the scan mode, the scan-enable signal se and the disable signal dis are asserted. The test pattern is loaded into the flip-flops $102_1$–$102_O$ during the scan cycles 302. After the falling edge 601 of the last cycle of the scan cycles 302, but before the rising edge of the capture pulse CP, the scan-enable signal se is deasserted. At the falling edge 601, the disable signal dis is deasserted for the predetermined time duration, during which the TSDs are enabled. In this embodiment, the rising edge 605 of the disable signal dis at the end of the predetermined time duration occurs during the capture pulse CP. Thus, the capture pulse CP occurs before the TSDs $106_1$–$106_N$ are disabled, thereby loading the capture data into the register 122.

During the capture pulse, the capture data from the register 122 propagates through the logic circuit 504 to the still enabled TSDs $126_1$–$126_L$. Because the predetermined time duration $\Delta t$ prevents burnout of the TSDs $126_1$–$126_L$, the capture data is not constrained to avoid high current conditions in the TSDs $126_1$–$126_L$ as is required using conventional testing schemes. Thus, significantly less time is needed to generate the test patterns and, moreover, the test coverage is more complete. Of course, in this embodiment, the test pattern loaded into the register 102 remains constrained to avoid high current conditions in the TSDs $106_1$–$106_N$ so that valid data will propagate to the logic circuit 114. In addition, this constraint is also required because the TSDs $106_1$–$106_N$ will be able to drive any output signals from logic circuit 502 from about the falling edge 603 of the disable signal dis, which is a significantly larger time than the predetermined time duration $\Delta t$ and could cause burnout.

Those skilled in the art of test circuits can easily implement a disable subcircuit 505 in the logic circuits 502 and 504 that generates the scan-enable signal se and disable signal dis from primary input signals during the scan mode as shown in FIG. 6.

Figure 7:
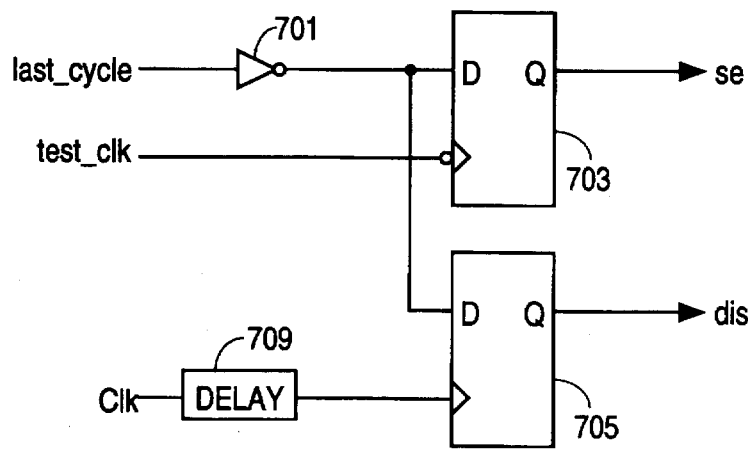
FIG. 7 is a schematic diagram of a disable signal generator according to one embodiment of the present invention.

FIG. 7 is a schematic diagram of one embodiment of the disable subcircuit 505 (FIG. 5) according to the present invention for use with a multiplexed scan design scheme. In a multiplexed scan design scheme, the flip-flops in the scan chain do not have a separate scan clock input terminal. Instead, the scan clock and the functional mode clock are multiplexed to the clock input terminal of the scan chain flip-flops.

In this embodiment, the disable subcircuit 505 includes an inverter 701, D flip-flops 703 and 705 and an optional delay circuit 709. The disable subcircuit 505 uses signals generated from a state machine (not shown) implemented within the logic circuits 502 and 504 (FIG. 5). Such internal state machines are well known in the art of scan design test circuits and can easily be implemented by those skilled in the art without undue experimentation using this disclosure. The internal state machine generates a clock signal Clk, a last_cycle signal and a test_clk signal. The clock signal Clk provides the capture pulse CP and clock pulses for the scan cycles. The last_cycle signal is asserted and deasserted to form a "window" about the first half of the last clock cycle in each set of scan cycles (see FIG. 8). The test_clk signal provides pulses at the beginning and the end of a scan mode operation.

The inverter 701 is coupled to received the last_cycle signal from the state machine (not shown). The output lead of the inverter 701 is connected to the D input terminals of the flip-flops 703 and 705. Thus, the flip-flops 703 and 705 receive the complement of the last_cycle signal. The flip-flop 703 has an inverted clock input terminal, which is coupled to receive the test_clk signal from the state machine. The output signal of the flip-flop 703 serves as the scan-enable signal se. The flip-flop 705 receives the clock signal Clk through the delay circuit 709. The output signal of the flip-flop 705 serves as the disable signal dis.

Figure 8:
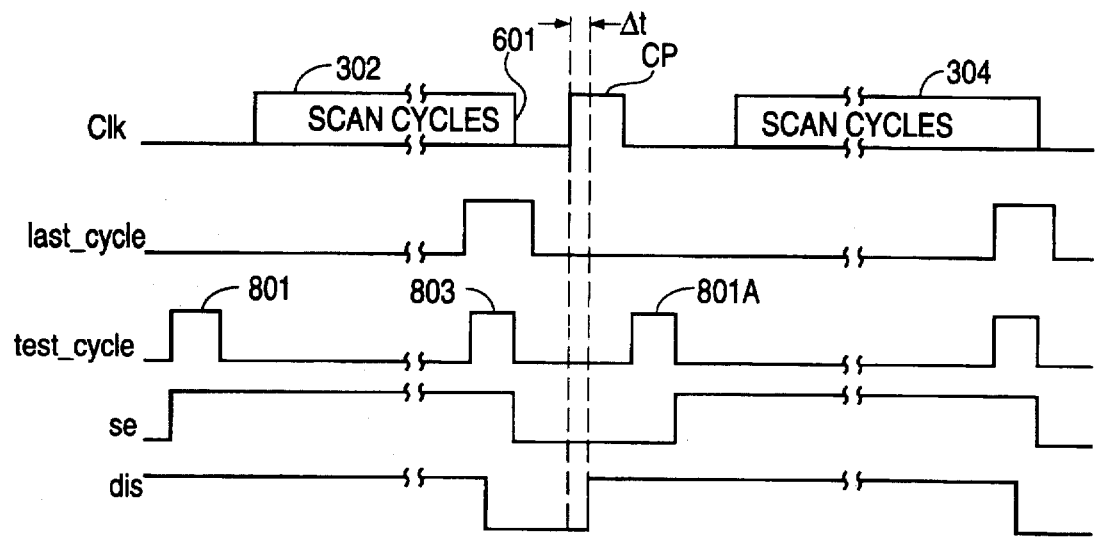
FIG. 8 is a timing diagram illustrating the operation of the circuit depicted in FIG. 5 using the subcircuit depicted in FIG. 7.

Referring to FIGS. 5, 7 and 8, the disable circuit 505 operates in the scan mode as follows. In this example, the scan mode begins when the state machine provides a pulse 801 in the test_clk signal. On the falling edge of the pulse 801, the last_cycle signal is at a logic low level. As a result, the flip-flop 703 (which is clocked on the falling edge of the test_clk signal) loads a logic high level (i.e., the complement of the last_cycle signal), thereby causing the scan-enable signal se to be asserted. Because the state machine (not shown) keeps the last_cycle signal deasserted until slightly before the last clock cycle of the scan cycles 302, the scan-enable signal remains asserted until the falling edge of the pulse 803 of the test_clk signal. Accordingly, the register 102 is loaded with the test pattern during the scan cycles 302. Then at the falling edge of the pulse 803, a logic low level is loaded into the flip-flop 703, thereby causing the scan-enable signal se to be deasserted. The falling edge of the scan-enable signal se then allows the flip-flops $122_1$–$122_M$ to receive the output signals of the logic circuit 114 on the rising edge of the capture pulse CP of the clock signal Clk.

Referring back to the start of this scan mode operation, the flip-flop 705 is loaded with a logic high level (the complement of the last_cycle signal) during functional mode operation or the last cycle of a previous scan mode operation. Thus, the disable signal is shown asserted at the start of the clock cycle 801. During the scan cycles 302, the state machine (not shown) keeps the last_cycle signal deasserted until slightly before the last dock cycle of the scan cycles 302. As a result, the disable signal dis remains asserted until about the rising edge of the last clock cycle of the scan cycles 302. The rising edge of the last clock cycle of the scan cycles 302 is delayed by the delay circuit 709, thereby causing the flip-flop disable signal dis is deasserted. Consequently, the TSDs are enabled about a half cycle before the scan-enable signal is deasserted.

Slightly after the falling edge 601 of the scan cycles 302, the last_cycle signal is deasserted by the state machine (not shown). The cycle following the scan cycles 302 includes the capture pulse CP, which loads into the register 122 the capture data resulting from the test pattern propagating through the logic circuits 502 and 114. However, the logic high level from the complemented last_cycle signal does not get loaded into the flip-flop 705 until the rising edge of the capture pulse CP propagates through the delay circuit 709. Thus, the flip-flop 705 asserts the disable signal dis after a slight delay relative to the rising edge of the capture pulse CP, thereby generating the predetermined time duration $\Delta t$. Then in the pulse 801A, the falling edge of the test_clk signal causes the flip-flop 703 to assert the scan-enable signal se, which causes the register 122 to be scanned-out during the scan cycles 304.

During normal functional mode, the state machine (not shown) causes the last_cycle signal to remain at a logic high level, thereby deasserting both the disable signal dis and the scan-enable signal se. Of course, in light of this disclosure, those skilled in the art of test circuits can provide, without undue experimentation, different circuits that enable the TSDs for a predetermined duration within the high current condition tolerance of the devices implementing the TSDs.

The delay circuit 709 is used to add a relatively small delay to the clock signal Clk and can be adjusted to set the predetermined time duration $\Delta t$. The delay circuit can be implemented using any suitable circuit. For example, the delay circuit 709 may simply be an extra length of the signal line bringing the clock signal Clk to the OR gate 707 to add a delay. The output signal of the flip-flop 705 serves as the disable signal dis.

Figure 9:
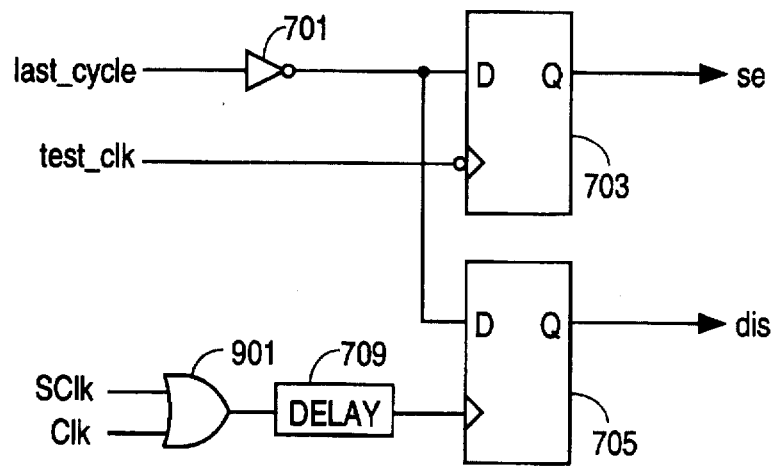
FIG. 9 is a schematic diagram of a disable signal generator according to another embodiment of the present invention.
Figure 10:
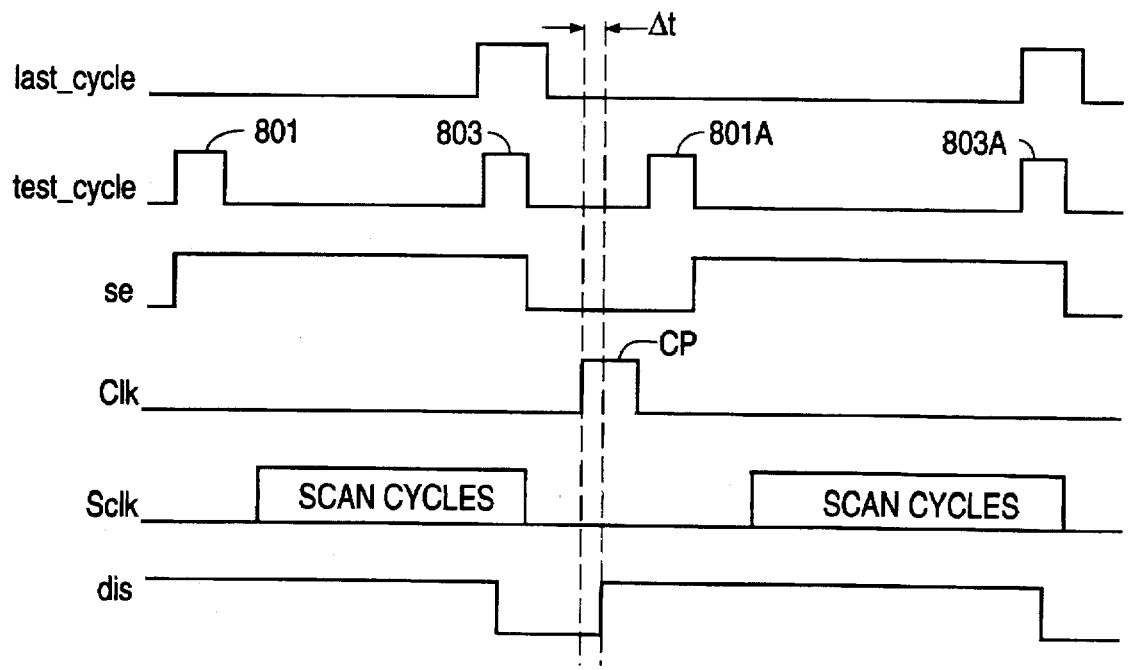
FIG. 10 is a timing diagram illustrating the operation of the circuit depicted in FIG. 5 using the subcircuit depicted in FIG. 9.

FIG. 9 is a schematic diagram illustrating a disable signal generator 505 for use with a docked scan scheme, according to one embodiment of the present invention. This embodiment is substantially similar to the embodiment of FIG. 7 except that an OR gate 901 is added to provide the logical OR of the scan clock signal Sclk and the clock signal Clk. FIG. 10 is a timing diagram illustrating the operation of the circuit depicted in FIG. 9. In this embodiment, the internal state machine (not shown) in effect respectively separates the capture pulse CP and the scan cycles of the dock signal Clk (FIG. 8) into the dock signal Clk (FIG. 10) and the scan clock signal Sclk of this embodiment. However, because the clock signal Clk and the scan clock signal Sclk are "OK'd" by OR gate 901, the generation of the scan enable signal se and the disable signal dis is substantially identical to the embodiment of FIG. 7.

The embodiments of the method and structure for testing a circuit with reduced test pattern generation constraints described above are illustrative of the principles of this invention and are not intended to limit the invention to the particular embodiments described. For example, using this disclosure, those skilled in the art of test circuit design can implement different embodiments of the disable subcircuit without undue experimentation. In addition, using this disclosure, those skilled in the art of test circuit design can implement embodiments adapted for docked scan testing schemes without undue experimentation. Accordingly, while a preferred embodiment of the invention has been illustrated and described, it will be appreciated that in view of this disclosure, various changes can be made therein without departing from the spirit and scope of the invention.

The embodiments of the invention in which an exclusive property or privilege is claimed are defined as follows:

1. A method for testing a circuit, said method comprising:
   loading a first storage element of said circuit with a first test value while said circuit is in a test mode;
   loading a second storage element of said circuit with a second test value while said circuit is in said test mode;
   providing a first input signal dependent on said first test value to a first logic circuit of said circuit;
   providing a second input signal dependent on said second test value to said first logic circuit;
   causing said first logic circuit to provide a first output signal and a second output signal, said first and second output signals dependent on said first and second input signals;
   providing said first output signal to a first driver, said first driver providing on an output lead of said first driver a first driver output signal dependent on said first output signal; and
   providing said second output signal to a second driver, said second driver providing on an output lead of said second dryer a second driver output signal dependent on said second output signal, said output lead of said second driver being electrically connected to said output lead of said first driver,
   wherein, said first driver and said second driver provide said first driver output signal and said second driver output signal substantially simultaneously, said first driver output signal having a logic value different from a logic value of said second driver output signal.

2. The method of claim 1 wherein said first and second drivers having a high current duration tolerance, said first and second drivers providing said first driver output signal and said second driver output signal for a predetermined time duration within said high current duration tolerance.

3. The method of claim 2 wherein said predetermined time duration is about one quarter to about two nanoseconds.

4. The method of claim 1 further comprising:

loading a third storage element with a value dependent on said first test value, said third storage element coupled to said first logic circuit;

loading a fourth storage element with a value dependent on said second test value, said fourth storage element coupled to said first logic circuit; and providing said first input signal to said first logic circuit from said third storage element, said first input signal having a logic value dependent on said value stored in said third storage element; and providing said second input signal to said first logic circuit from said fourth storage element, said second input signal having a logic value dependent on said value stored in said fourth storage element.

5. The method of claim 4 further comprising:

providing a first intermediate input signal to said third storage element from a second logic circuit, said value stored in said third storage element dependent on said first intermediate input signal; and providing a second intermediate input signal to said fourth storage element from said second logic circuit, said value stored in said fourth storage element dependent on said second intermediate input signal, wherein said second logic circuit provides said first and second intermediate input signals with dependence on said first and second test values.

6. The method of claim 5 further comprising:

providing a first test signal dependent on said first test value from said first storage element to a third logic circuit;

providing a second test signal dependent on said second test value from said second storage element to said third logic circuit; and providing a third intermediate input signal to said second logic circuit from said third logic circuit, said third logic circuit providing said third intermediate input signal as a function of said first and second test values, wherein said third intermediate input signal causes in part said second logic circuit to provide said first and second intermediate input signals.

7. The method of claim 6 further comprising:

providing a first test value signal dependent on said first test value from said first storage element to said third logic circuit;

providing a second test value signal dependent on said second test value from said first storage element to said third logic circuit;

providing a first intermediate output signal from said third logic circuit to a third driver, said first intermediate output signal being a function of said first and second test value signals; and providing a second intermediate output signal from said third logic circuit to a fourth driver, said second intermediate output signal being a function of said first and second test value signals, wherein said third intermediate input signal is outputted by said third and fourth drivers on a single lead to said second logic circuit.

8. The method of claim 7 wherein said first and second test values are constrained to prevent said third logic circuit from providing signals to said third and fourth drivers that cause said third and fourth drivers from outputting signals of different logic values.

9. The method of claim 4 wherein said first, second, third and fourth storage elements each comprises a flip-flop.

10. The method of claim 9 wherein said first, second, third and fourth storage elements form part of a scan chain.

11. The method of claim 1 wherein said first and second drivers are three state drivers.

12. A circuit comprising:

a first logic circuit having a first input lead, a second input lead, a first output lead, and a second output lead;

a first storage element having an output lead coupled to said first input lead of said first logic circuit;

a second storage element having an output lead coupled to said second input lead of said first logic circuit;

a first dryer circuit having an input terminal coupled to said first output lead of said first logic circuit, wherein said first driver circuit is capable of providing at an output lead of said first driver circuit an output signal dependent on a signal received at said input terminal of said first driver circuit;

a second driver circuit having an input terminal coupled to said second output lead of said first logic circuit and having an output lead connected to said output lead of said first driver circuit, wherein said second driver circuit is capable of providing at said output lead of said second driver circuit an output signal dependent on a signal received at said input terminal of said second driver circuit; and a subcircuit coupled to said first dryer circuit and said second driver circuit, wherein said subcircuit is capable of providing a first signal to said first driver circuit and a second signal to said second driver circuit, and wherein, during a test operation, said first and second signals are capable of causing said first and second driver circuits to be enabled substantially simultaneously for a predetermined time duration during which said first driver circuit enters a high current condition.

13. The circuit of claim 12 wherein said second driver circuit enters a high current condition during said predetermined time duration.

14. The circuit of claim 13 wherein said output signals of said first and second driver circuits are of different logic levels during said predetermined time duration.

15. The circuit of claim 12 wherein said predetermined time duration is about one quarter to about two nanoseconds.

16. The circuit of claim 12 wherein said first logic circuit includes said subcircuit.

17. The circuit of claim 12 wherein said first and second drivers each comprise a three state driver.

18. The circuit of claim 12 further comprising:

a second logic circuit having an input lead coupled to said output leads of said first and second driver circuits;

a third storage element having an input lead coupled to a first output lead of said second logic circuit; and a fourth storage element having an input lead coupled to a second output lead of said second logic circuit, wherein during said test operation, said second logic circuit provides a third output signal and a fourth output signal to said third and fourth storage elements, respectively, said third and fourth output signals depending on said a test pattern loaded into said first and second storage elements, said third and fourth storage elements respectively storing third and fourth values dependent on said third and fourth output signals, respectively.

19. The circuit of claim 18 wherein during said predetermined time duration said third driver circuit drives a signal of a first logic level while said fourth driver circuit drives a signal of a second logic level different from said first logic level.

20. The circuit of claim 18 wherein said third and fourth values are provided to a third logic circuit having a first output lead coupled to a third driver circuit and having a second output lead coupled to a fourth driver circuit, said third and fourth driver circuits driving a single conductive line, wherein in response to said third and fourth values said third logic circuit causes said third and fourth driver circuits to be enabled substantially simultaneously for said predetermined time duration during which said third driver circuit enters a high current condition.

21. The circuit of claim 18 wherein said first, second, third and fourth storage elements each comprises a flip-flop.

22. The circuit of claim 21 wherein said first, second, third and fourth storage elements form part of a scan chain.

23. An electronic system comprising:
- a processor; and
- a memory coupled to said processor,
- wherein said processor further comprises:
    - a first logic circuit having a first input lead, a second input lead, a first output lead, and a second output lead;
    - a first storage element having an output lead coupled to said first input lead of said first logic circuit;
    - a second storage element having an output lead coupled to said second input lead of said first logic circuit;
    - a first driver circuit having an input terminal coupled to said first output lead of said first logic circuit, wherein said first driver circuit is capable of providing at an output lead of said first driver circuit an output signal dependent on a signal received at said input terminal of said first driver circuit;
    - a second driver circuit having an input terminal coupled to said second output lead of said first logic circuit and having an output lead connected to said output lead of said first driver circuit, wherein said second driver circuit is capable of providing at said output lead of said second driver circuit an output signal dependent on a signal received at said input terminal of said second driver circuit; and
    - a subcircuit coupled to said first driver circuit and said second driver circuit, wherein said subcircuit is capable of providing a first signal to said first driver circuit and a second signal to said second driver circuit, and wherein, during a test operation, said first and second signals are capable of causing said first and second driver circuits to be enabled substantially simultaneously for a predetermined time duration during which said first driver circuit enters a high current condition.

24. The electronic system of claim 23 wherein said second driver circuit enters a high current condition during said predetermined time duration.

25. The electronic system of claim 24 wherein said output signals of said first and second driver circuits are of different logic levels during said predetermined time duration.

26. The electronic system of claim 23 wherein said predetermined time duration is about one quarter to about two nanoseconds.

27. The electronic system of claim 23 further comprising:
- a second logic circuit having an input lead coupled to said output leads of said first and second driver circuits;
- a third storage element having an input lead coupled to a first output lead of said second logic circuit; and
- a fourth storage element having an input lead coupled to a second output lead of said second logic circuit,
- wherein during said test operation, said second logic circuit provides a third output signal and a fourth output signal to said third and fourth storage elements, respectively, said third and fourth output signals depending on said a test pattern loaded into said first and second storage elements.

28. The electronic system of claim 27 wherein said first, second, third and fourth storage elements each comprise a flip-flop.

29. The electronic system of claim 28 wherein said first, second, third and fourth storage elements form part of a scan chain.

30. The electronic system of claim 23 further comprising:
- an interface circuit coupled to said processor; and
- a peripheral coupled to said interface circuit, said electronic system implementing a computer system.

31. The electronic system of claim 23 wherein said first logic circuit includes said subcircuit.

32. The electronic system of claim 23 wherein said first and second drivers each comprise a three-state driver.

* * * * *

UNITED STATES PATENT AND TRADEMARK OFFICE
CERTIFICATE OF CORRECTION

PATENT NO. : 5,740,182
DATED : April 14, 1998
INVENTOR(S) : Narain, Prakash

It is certified that error appears in the above-identified patent and that said Letters Patent is hereby corrected as shown below:

Col. 5, line 6, change "$407_N$" to --$407_n$--.

Col. 6, line 65, change "Clk" to --*Clk*--.

Col. 9, delete lines 45 to 50.

Col. 9, line 55, delete "value".

Col. 9, line 59, delete "value".

Col. 9, line 66, delete "from outputting" and insert --to output--.

Col. 10, line 53, delete "driver circuits" and insert --storage elements--.

Signed and Sealed this

Eighth Day of September, 1998

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,740,182
DATED : April 14, 1998
INVENTOR(S) : Prakash Narain

Page 1 of 1

It is certified that error appears in the above-identified patent and that said Letters Patent is hereby corrected as shown below:

Column 8, claim 1,
Line 51, delete "dryer" and insert -- driver --;

Column 10, claim 12,
Line 14, delete "dryer" and insert -- driver --;
Line 28, delete "dryer" and insert -- driver --;

Signed and Sealed this

Fifteenth Day of January, 2002

Attest:

JAMES E. ROGAN
*Attesting Officer*    *Director of the United States Patent and Trademark Office*